(12) United States Patent
Wang et al.

(10) Patent No.: US 10,879,450 B1
(45) Date of Patent: Dec. 29, 2020

(54) METHOD OF FABRICATING A SEMICONDUCTOR DEVICE

(71) Applicant: Semiconductor Manufacturing Electronics (ShaoXing) Corporation, Zhejiang (CN)

(72) Inventors: Yongtao Wang, Zhejiang (CN); Chong Wang, Zhejiang (CN); Minhao Cai, Zhejiang (CN); Shaohua Xiang, Zhejiang (CN)

(73) Assignee: SEMICONDUCTOR MANUFACTURING ELECTRONICS (SHAOXING) CORPORATION, Zhejiang (CN)

( * ) Notice: Subject to any disclaimer, the term of this patent is extended or adjusted under 35 U.S.C. 154(b) by 0 days.

(21) Appl. No.: 16/984,777

(22) Filed: Aug. 4, 2020

(30) Foreign Application Priority Data

Mar. 31, 2020 (CN) .......................... 2020 1 0246888

(51) Int. Cl.
| | |
|---|---|
| H04R 17/00 | (2006.01) |
| H01L 41/293 | (2013.01) |
| H03H 9/54 | (2006.01) |
| H01L 41/047 | (2006.01) |
| H01L 41/09 | (2006.01) |
| H01L 41/332 | (2013.01) |
| H01L 41/297 | (2013.01) |
| H01L 41/083 | (2006.01) |
| H01L 41/27 | (2013.01) |

(52) U.S. Cl.
CPC ........ *H01L 41/293* (2013.01); *H01L 41/0471* (2013.01); *H01L 41/0472* (2013.01); *H01L 41/083* (2013.01); *H01L 41/09* (2013.01); *H01L 41/27* (2013.01); *H01L 41/297* (2013.01); *H01L 41/332* (2013.01); *H03H 9/545* (2013.01)

(58) Field of Classification Search
CPC .................................................... H03H 9/545
See application file for complete search history.

(56) References Cited

U.S. PATENT DOCUMENTS

| | | | |
|---|---|---|---|
| 9,978,894 B2 * | 5/2018 | Jorgenson | H01L 31/02327 |
| 10,361,677 B2 * | 7/2019 | Bower | H03H 9/02062 |
| 2003/0000058 A1 * | 1/2003 | Tsai | H03H 3/02 29/25.35 |

* cited by examiner

*Primary Examiner* — Paul D Kim
(74) *Attorney, Agent, or Firm* — Muncy, Geissler, Olds & Lowe, P.C.

(57) ABSTRACT

A method of fabricating the semiconductor device includes the following steps. Forming a sacrificial portion at a first end of an upper electrode layer before a passivation layer is formed so that it supports a corresponding end portion of the passivation layer, making the passivation layer not suspended at all. In this way, the suspended portion of the passivation layer will not be damaged during the formation of a contact pad. In addition, subsequent to the formation of the contact pad, removing the sacrificial portion, freeing up a space under the end portion of the passivation layer so that the end portion itself becomes a suspended portion. This can ensure performance of the resulting semiconductor device.

10 Claims, 5 Drawing Sheets

Fig. 1a

Prior Art

Fig. 1b

Prior Art

METHOD OF FABRICATING A
SEMICONDUCTOR DEVICE

CROSS-REFERENCE TO RELATED
APPLICATION

This application claims the priority of Chinese patent application number 202010246888.2, filed on Mar. 31, 2020, the entire contents of which are incorporated herein by reference.

TECHNICAL FIELD

The present invention relates to the field of semiconductor technology and, in particular, to a semiconductor device and a method of fabricating the semiconductor device.

BACKGROUND

Figure 1A:
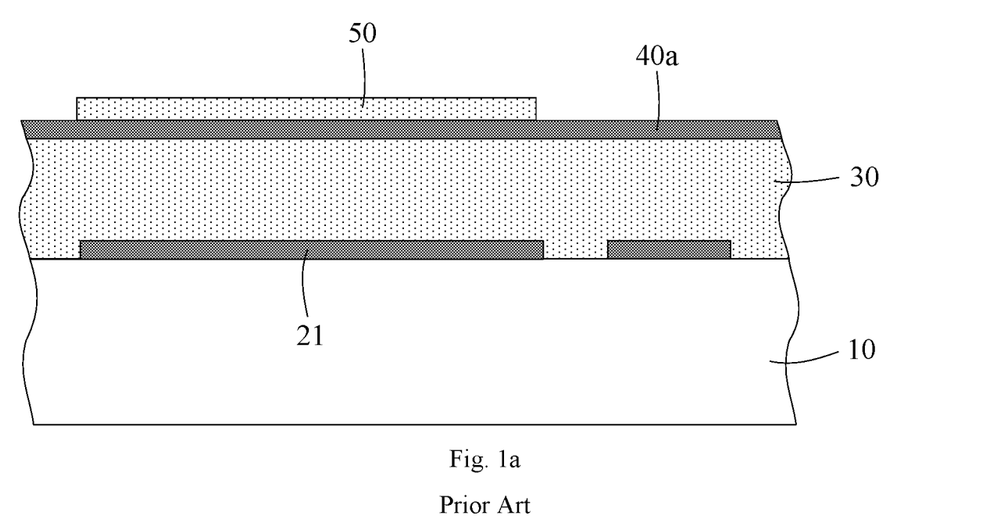
FIGS. 1a and 1b are schematic illustrations of structures resulting from a conventional method of fabricating a semiconductor device.
Figure 1B:
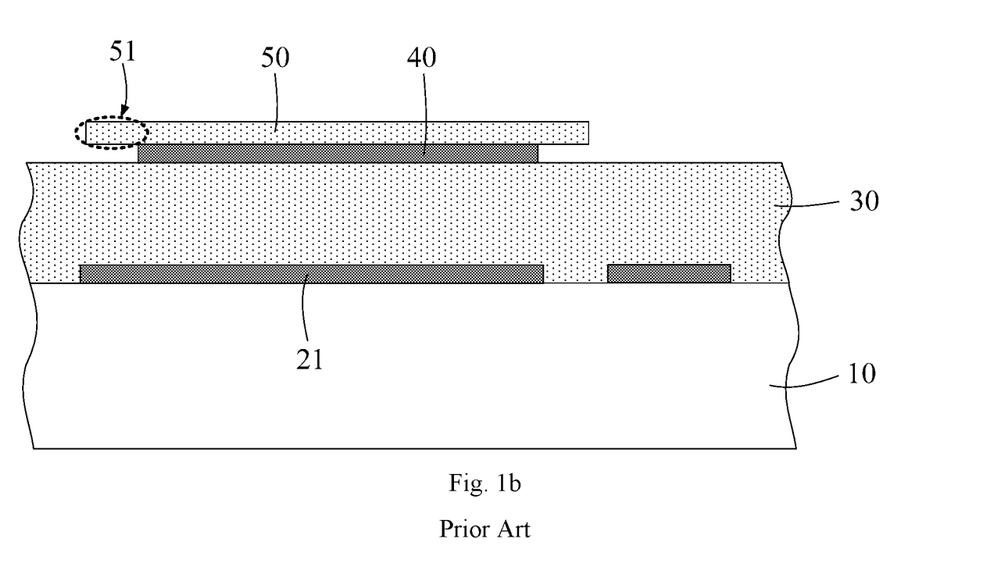

Semiconductor devices made of piezoelectric materials exhibiting the converse piezoelectric effect are key components of crystal oscillators and filters and are frequently used in bulk acoustic wave (BAW) filters. FIGS. 1a to 1b schematically show structures resulting from steps in a conventional method for fabricating a semiconductor device. As shown in FIGS. 1a and 1b, the method includes the steps detailed below.

In Step 1, with particular reference to FIG. 1a, a substrate 10 is provided, on which a lower electrode layer 21 and a piezoelectric material layer 30 are sequentially formed. Additionally, an upper electrode material layer 40a and a patterned passivation layer 50 are formed above the lower electrode layer 21 and the piezoelectric material layer 30.

In Step 2, with particular reference to FIG. 1b, an upper electrode layer 40 is formed by etching the upper electrode material layer 40a using an etching process.

Specifically, during the etching of the upper electrode material layer 40a, an etchant used in the etching process also etches laterally, removing part of the upper electrode material layer 40a under the passivation layer 50, so that each edge of the resulting upper electrode layer 40 is shorter than the corresponding edge of the passivation layer 50. That is, an outer edge of the passivation layer 50 extends beyond the upper electrode layer 40. As a result, it is at least partially suspended above the piezoelectric material layer 30, resulting in the formation of a suspended portion 51.

In Step 3, a lift-off process is performed to form a contact pad for electrically leading out the upper or lower electrode layer.

Specifically, the lift-off process may include: first of all, forming a photoresist layer over the substrate 10, which covers the passivation layer 50, and in which an opening is formed, so that a location where the contact pad is to be formed is exposed; then forming a conductive material layer, which partially covers the photoresist layer and partial resides in the opening; and subsequently, lifting off the photoresist layer to remove a portion of the conductive material covering the photoresist layer, so that the conductive material remaining in the opening forms the contact pad.

It is to be noted that, in the lift-off process, the photoresist is usually lifted off by spaying a liquid at a high pressure onto the photoresist layer. However, when acting on the passivation layer 50, such a high spray pressure may cause damage to the suspended portion 51. This is usually avoided by using a lower spay pressure, which, however, may be not able to thoroughly remove the photoresist layer. In addition, photoresist tends to be filled in a space under the suspended portion 51, contributing to incomplete photoresist removal.

SUMMARY OF THE INVENTION

It is an objective of the present invention to solve the above-described problem with the conventional method, i.e., easy damage to a suspended portion of a passivation layer by presenting a method of fabricating a semiconductor device.

To this end, the present invention provides a method of fabricating a semiconductor device. The method includes:
providing a substrate having a lower electrode layer and a lead-out electrode formed thereon, the substrate further having a piezoelectric material layer formed over the lower electrode layer and the lead-out electrode;
forming an upper electrode layer and a sacrificial portion on the piezoelectric material layer, the sacrificial portion having a side surface adjacent to a side surface of a first end of the upper electrode layer;
forming a passivation layer covering a top surface of the upper electrode layer and a top surface of the sacrificial portion with at least one side surface of the sacrificial portion being exposed;
etching the piezoelectric material layer to form a contact window in which the lead-out electrode is exposed, and forming a contact pad on the lead-out electrode, the contact pad electrically connected to the lead-out electrode and configured for electrically leading out the upper electrode layer or the lower electrode layer; and
removing the sacrificial portion to form a gap under the passivation layer, so that a portion of the passivation layer above the gap defines a suspended portion.

Optionally, the sacrificial portion is formed subsequent to the formation of the upper electrode layer, and wherein forming the sacrificial portion includes:
forming a sacrificial material layer; and
partially removing the sacrificial material layer so that a portion of the sacrificial material layer on the side surface of the first end of the upper electrode layer is remained and forms the sacrificial portion.

Optionally, a portion of the sacrificial portion that is covered by the passivation layer may have a width of from 0.7 μm to 3 μm.

Optionally, removing the sacrificial portion may include etching away the sacrificial portion by a wet etching process.

Optionally, the passivation layer may entirely cover the top surface of the sacrificial portion, with a side surface of the passivation layer being aligned with a side surface of the sacrificial portion, or wherein the passivation layer partially covers the top surface of the sacrificial portion, with the side surface of the sacrificial portion protruding beyond the side surface of the passivation layer.

Optionally, the lead-out electrode may be configured to electrically leading out the upper electrode layer, wherein subsequent to the formation of the passivation layer, a second end of the upper electrode layer that is located close to the lead-out electrode is exposed and electrically connected to the lead-out electrode using a conductive material.

Optionally, the formation of the contact pad may include:
forming a photoresist layer covering the piezoelectric material layer and the passivation layer and having an opening formed therein, the opening in the photoresist layer exposing the contact window;
forming a conductive material layer covering the photoresist layer and inner surfaces of the contact window exposed in the opening so as to be connected to the lead-out electrode; and lifting off the photoresist layer so that a portion of the conductive material layer overlying the photoresist layer is removed, with a remaining portion of the conductive material layer in the opening forming the contact pad.

Optionally, subsequent to the formation of the passivation layer, the second end of the upper electrode layer close to the lead-out electrode may be exposed, wherein during the formation of the photoresist layer, both the contact window and the second end of the upper electrode layer are exposed in the opening, and wherein the conductive material layer is formed to also cover the second end of the upper electrode layer so as to electrically connecting the second end to the contact pad.

Optionally, a filling layer may be formed in the substrate under the lower electrode layer, wherein the method further includes: forming a through hole in the piezoelectric material layer or in the substrate, the through hole extending to the filling layer; and forming a cavity in the substrate by removing the filling layer via the through hole while removing the sacrificial portion.

Optionally, the semiconductor device may include a bulk acoustic wave (BAW) filter.

In the method provided in the present invention, after the upper electrode layer is formed, the sacrificial portion is formed at the first end of the upper electrode layer, and the passivation layer covers both the upper electrode layer and the sacrificial portion so that the passivation layer is supported at a corresponding end by the sacrificial portion and is not suspended at all. As a result, the passivation layer is able to withstand a larger pressure and will not be damaged at said end portion in a subsequent process.

For example, the passivation layer is able to withstand a high liquid spray pressure without breakage during a lift-off process for forming the contact pad and allows an even higher lift-off spray pressure during the removal of photoresist. This enables increased photoresist lift-off efficiency and mitigates the problem of incomplete photoresist removal. In addition, during the lift-off process, no photoresist will be filled under the passivation layer because it is not suspended at all. This additionally mitigates the problem of incomplete photoresist removal.

LIST OF REFERENCE NUMERALS IN THE DRAWINGS

10/100 Substrate
21/210 Lower Electrode Layer
220 Lead-out Electrode
30/300 Piezoelectric Material Layer
310 Contact Window
40a Upper Electrode Material Layer
40/410 Upper Electrode Layer
420 Sacrificial Portion
50/500 Passivation Layer
51/510 Suspended Portion
600 Contact Pad

DETAILED DESCRIPTION

Figure 2:
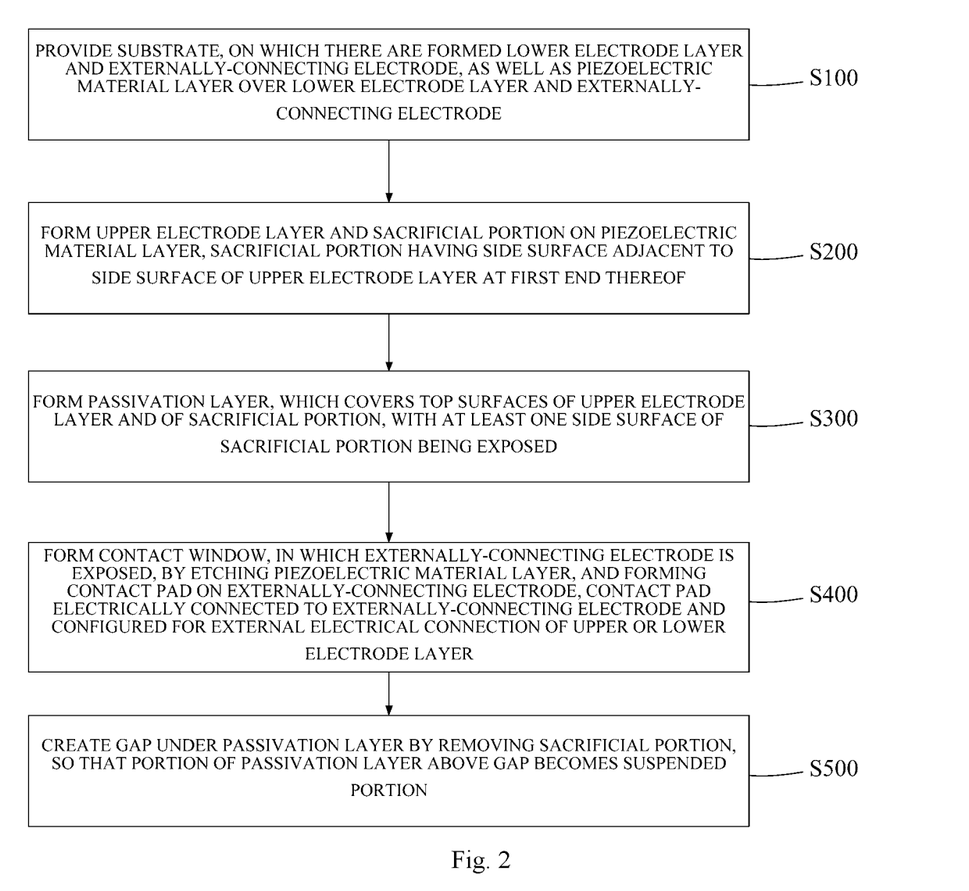
FIG. 2 is a flowchart of a method of fabricating a semiconductor device according to an embodiment of the present invention.

As described in the Background section, during the conventional semiconductor device fabrication, a suspended portion of a passivation layer is prone to damage in a subsequent process, which is harmful to the performance of the resulting semiconductor device. In order to overcome this problem, there is provided herein a method for fabricating a semiconductor device. For example, with reference to FIG. 2, the method includes:

in Step S100, providing a substrate having a lower electrode layer and a lead-out electrode formed thereon, the substrate further having a piezoelectric material layer formed over the lower electrode layer and the lead-out electrode;

in Step S200, forming an upper electrode layer and a sacrificial portion on the piezoelectric material layer, the sacrificial portion having a side surface adjacent to a side surface of the upper electrode layer at a first end thereof;

in Step S300, forming a passivation layer, which covers top surfaces of the upper electrode layer and of the sacrificial portion, with at least one side surface of the sacrificial portion being exposed;

in step S400, forming a contact window, in which the lead-out electrode is exposed, by etching the piezoelectric material layer, and forming a contact pad on the lead-out electrode, the contact pad electrically connected to the lead-out electrode and configured for electrically leading out the upper or lower electrode layer; and in step S500, forming a gap under the passivation layer by removing the sacrificial portion, so that a portion of the passivation layer above the gap defines a suspended portion.

Therefore, in the method provided herein, the end portion of the passivation layer sought to be protected from damage during fabrication of the contact pad is supported and protected by the sacrificial portion formed at the first end of the upper electrode layer. In addition, subsequent to the formation of the contact pad, the sacrificial portion is removed, freeing up the space under the end portion of the passivation layer and thus turning this end portion into a suspended portion. In this way, performance of the resulting semiconductor device can be ensured.

The proposed semiconductor device and method will be described in greater detail below by way of specific embodiments and with reference to the accompanying drawings. Features and advantages of the invention will be more apparent from the following detailed description. Note that the figures are provided in a very simplified form not necessarily presented to scale, with their only intention to facilitate convenience and clarity in explaining the embodiments.

FIGS. 3a to 3g schematically illustrate structures resulting from a method for fabricating a semiconductor device according to an embodiment of the present invention.

Figure 3A:
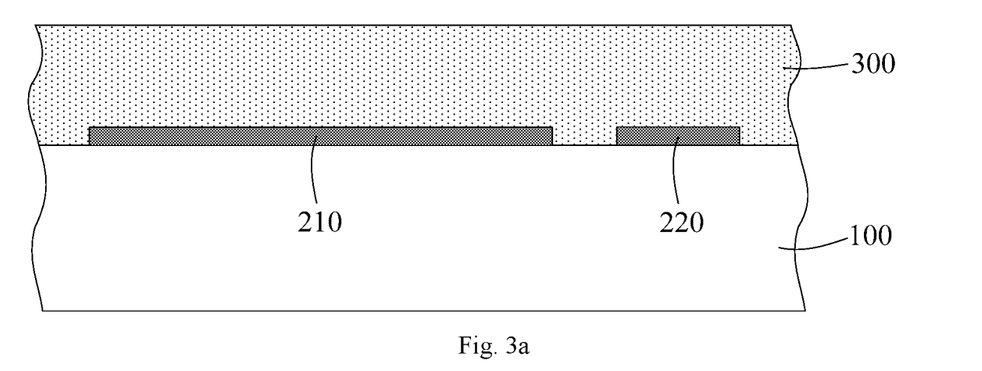
FIGS. 3a to 3g schematically illustrate structures resulting from a method of fabricating a semiconductor device according to an embodiment of the present invention.

In step S100, with particular reference to FIG. 3a, a substrate 100 is provided, on which a lower electrode layer 210 and a lead-out electrode 220 are sequentially formed. In addition, a piezoelectric material layer 300 is formed over the lower electrode layer 210 and the lead-out electrode 220.

The substrate 100 may be selected depending on the actual use of the semiconductor device. For example, the semiconductor device may be a bulk acoustic wave (BAW) filter. In this case, the substrate may include a plurality of Bragg reflection layers for forming a solid mounted resonator (SMR). Alternatively, the substrate may include a cavity for forming a film bulk acoustic resonator (FBAR).

Further, materials from which the lower electrode layer 210 can be fabricated may include metallic materials including, for example, molybdenum (Mo). Material from which the piezoelectric material layer 300 can be fabricated may include at least one of zinc oxide (ZnO), aluminum nitride (AlN) and lead zirconate titanate (PZT).

In this embodiment, the lead-out electrode 220 is configured to electrically connect the lower electrode layer 210 or a subsequently-formed upper electrode layer so as to achieve electrically leading out the lower electrode layer 210 or the upper electrode layer. It is to be understood that in case of the lead-out electrode 220 being configured for electrically leading out the lower electrode layer 210, it can be considered that part of the lower electrode layer 210 constitutes the lead-out electrode 220. Alternatively, when the lead-out electrode 220 is configured for electrically leading out the subsequently-formed upper electrode layer, the upper electrode layer may be brought into electrical connection with the lead-out electrode 220 by a conductive material in a subsequent process.

Optionally, the lead-out electrode 220 and the lower electrode layer 210 may be simultaneously formed. Such formation may, for example, include: forming an electrode material layer on the substrate 100; and then forming the lead-out electrode 220 and the lower electrode layer 210 by patterning the electrode material layer. In case of the lead-out electrode 220 configured for electrically leading out the lower electrode layer 210, the lead-out electrode 220 and the lower electrode layer 210 may be so formed that they are connected to each other. When the lead-out electrode 220 is configured for electrically leading out the upper electrode layer, the lead-out electrode 220 and the lower electrode layer 210 may be so formed that they are separated from each other.

Figure 3B:
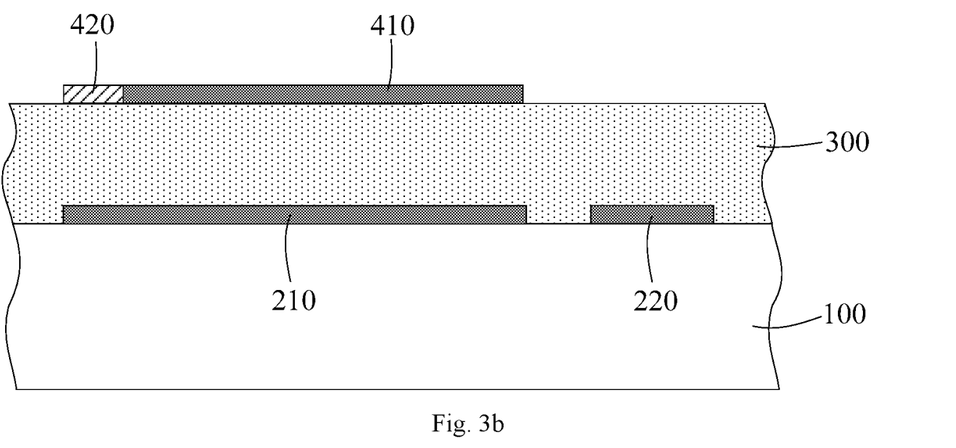

In step S200, with particular reference to FIG. 3b, an upper electrode layer 410 and a sacrificial portion 420 are formed on the piezoelectric material layer 300. A side surface of the sacrificial portion 420 is adjacent to a side surface of the upper electrode layer 410 at a first end of the upper electrode layer. The sacrificial portion 420 will be removed subsequently in order to free up the space that it occupied.

Further, projections of the lower electrode layer 210 and the upper electrode layer 410 on a single horizontal plane may at least partially overlap each other, while projections of the upper electrode layer 410 and the lead-out electrode 220 on a single horizontal plane may at least partially not overlap each other. In this embodiment, the lead-out electrode 220 is located on one side of the upper electrode layer 410. An end of the upper electrode layer 410 closer to the lead-out electrode 220 is defined as a second end thereof, while an end of the upper electrode layer 410 farther away from the lead-out electrode 220 is defined as a first end thereof.

The upper electrode layer 410 may be made of the same material as that of the lower electrode layer 210. Materials from which the sacrificial portion 420 can be fabricated may include insulating materials. More specifically, the insulating materials may include silicon oxide, silicon nitride or the like.

With continued reference to FIG. 3b, a top surface of the sacrificial portion 420 is aligned with a top surface of the upper electrode layer 410. Additionally, the sacrificial portion 420 may be formed, for example, by a method including: subsequent to the formation of the upper electrode layer 410, forming a sacrificial material layer; and then removing part of the sacrificial material layer so that the remaining part of the sacrificial material layer is adjacent to the side surface the upper electrode layer 410 at the first end thereof and forms the sacrificial portion 420 (i.e., the remaining part of the sacrificial material layer adjacent to the side surface of the upper electrode layer 410 at the first end thereof constitutes the sacrificial portion).

Figure 3C:
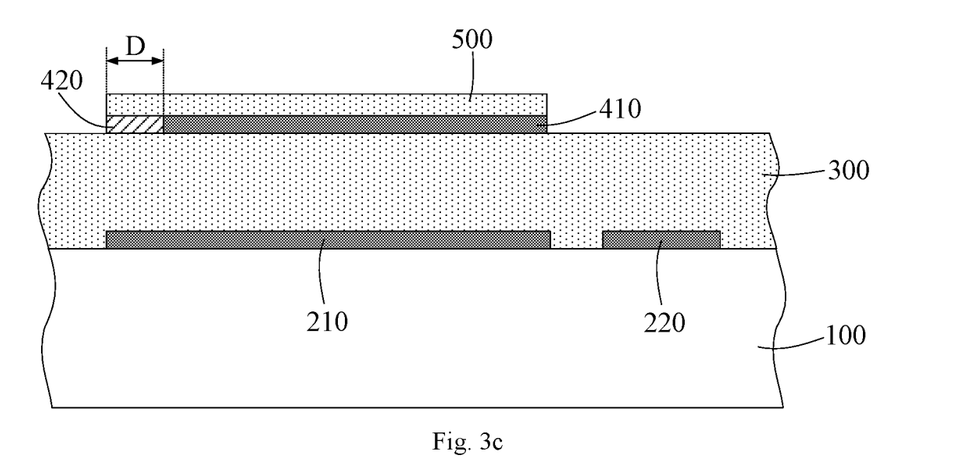

In step S300, with particular reference to FIG. 3c, a passivation layer 500 is formed, which covers the top surfaces of the upper electrode layer 410 and the sacrificial portion 420, with at least one side surface of the sacrificial portion 420 remaining exposed. That is, the passivation layer 500 does not cover any side surface of the sacrificial portion 420. The passivation layer 500 may be formed, for example, of the same material as that of the piezoelectric material layer 300. Examples of this material may include aluminum nitride (AlN) and the like.

Specifically, with the sacrificial portion 420 formed on the side surface of the upper electrode layer 410 at the first end thereof, the passivation layer 500 may extend to cover both the upper electrode layer 410 and the sacrificial portion 420 in such a manner that a side surface of the passivation layer 500 away from the upper electrode layer 410 does not extend beyond the side surface of the sacrificial portion 420 away from the upper electrode layer 410.

It is to be noted that, the arrangement with the side surface of the passivation layer 500 away from the upper electrode layer 410 not extending beyond the side surface of the sacrificial portion 420 away from the upper electrode layer 410 results either in the passivation layer 500 covering the entire top surface of the sacrificial portion 420 with its said side surface being aligned with said side surface of the sacrificial portion 420, or in the passivation layer 500 covering only part of the top surface of the sacrificial portion 420 with said side surface of the sacrificial portion 420 extending beyond said side surface of the passivation layer 500. This allows the upper electrode layer 410 and the sacrificial portion 420 to well support the overlying passivation layer 500. In other words, the passivation layer 500 does not have any suspended portion. As a result, the passivation layer 500 can withstand a greater force without damage in a subsequent process.

In the subsequent process, the sacrificial portion 420 will be removed, leading to the formation of a suspended portion of the passivation layer 500, which has a width equal to a width D of the portion of the sacrificial portion 420 previously covered by the passivation layer 500. The width D of the portion of the sacrificial portion 420 covered by the passivation layer 500 may, for example, range from 0.7 μm to 3 μm. Thus, the width of the suspended portion of the passivation layer 500 may, for example, also range from 0.7 μm to 3 μm. In this embodiment, the side surface of the passivation layer 500 away from the upper electrode layer 410 is aligned with the side surface of the sacrificial portion 420 away from the upper electrode layer 410. Therefore, the width of the resulting suspended portion of the sacrificial portion 420 is equal to the width of the sacrificial portion 420.

It is to be noted that, since the passivation layer 500 is supported by the sacrificial portion 420 at the corresponding end, it will hardly break (crack). For this reason, an additional increase in the width of the suspended portion is allowed by expanding the width of the sacrificial portion 420.

This embodiment will be further described in the above-discussed exemplary context with the lead-out electrode 220 being configured for electrically leading out the upper electrode layer 410. Accordingly, in further implementations, the method also includes the following steps.

Figure 3D:
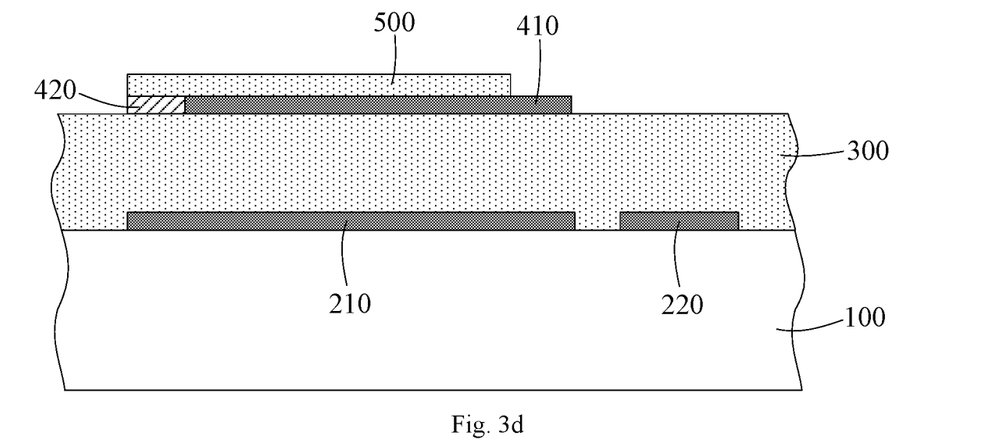

With particular reference to FIG. 3d, an end portion of the passivation layer 500 closer to the lead-out electrode 220 is removed so that a portion of the upper electrode layer 410 at the second end thereof closer to the lead-out electrode 220 is exposed. This allows the upper electrode layer 410 to be better electrically connected at the second end to the lead-out electrode 220 using a conductive material.

It is to be noted that, in this embodiment, the passivation layer 500 is formed by performing two etching processes on the passivation material and the second end of the upper electrode layer 410 is exposed in the second etching process. However, in other embodiments, the formation of the passivation layer 500 may also be accomplished by performing a single etching process on the passivation material, which leads to exposure of the second end of the upper electrode layer 410.

Figure 3E:
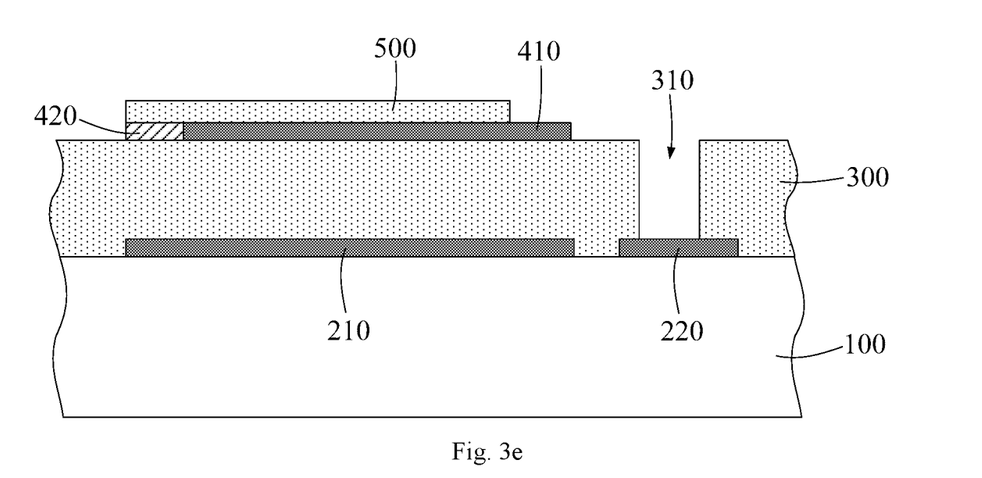
Figure 3F:
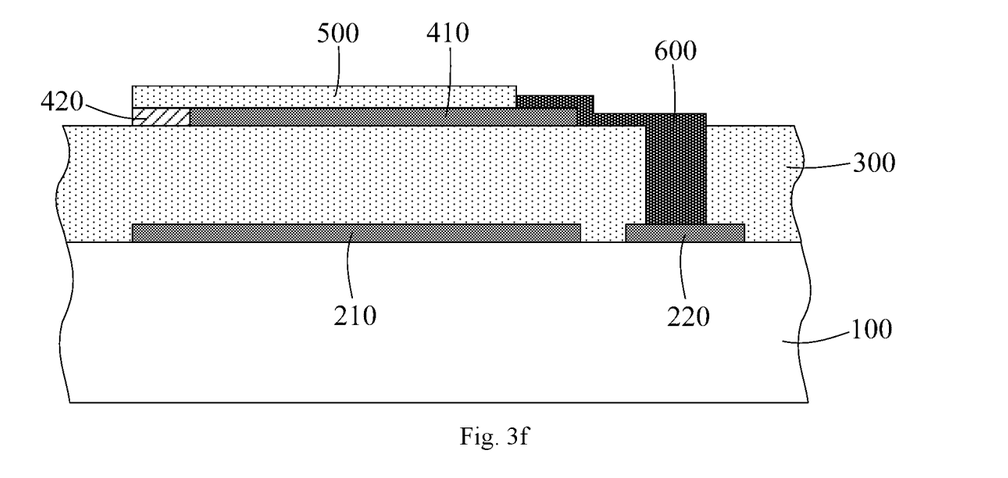

In step S400, with particular reference to FIGS. 3e and 3f, the piezoelectric material layer 300 is etched so that a contact window 310 is formed therein, in which the lead-out electrode 220 is exposed. A contact pad 600 is then formed on the lead-out electrode 220, which is electrically connected to the lead-out electrode 220 and configured for electrically leading out the upper electrode layer 410 or the lower electrode layer 210.

As noted above, this embodiment is described with the lead-out electrode 220 being electrically connected to the upper electrode layer 410 as an example. Accordingly, the contact window 310 may be formed around the second end of the upper electrode layer 410 so that the contact window 310 is close to the second end of the upper electrode layer 410 and the lead-out electrode 220 is exposed in the contact window 310. In this way, the contact window 310 enables both electrical connection of the contact pad 600 to the lead-out electrode 220 and electrical connection of the upper electrode layer 410 to both the lead-out electrode 220 and the contact pad 600.

Further, the contact pad 600 may be formed by a lift-off process. Specifically, the lift-off process for forming the contact pad 600 may include the steps detailed blow.

In Step 1, a photoresist layer is formed, which covers the piezoelectric material layer 300 and the passivation layer 500, and an opening is formed in the photoresist layer, in which the contact window 310 and hence the lead-out electrode 220 therein are exposed.

In this embodiment, the lead-out electrode 220 is configured for electrical connection of the upper electrode layer 410. Therefore, the second end of the upper electrode layer 410 and the lead-out electrode 220 may be both exposed in the opening in the photoresist layer. As such, electrical connection can be subsequently established by a conductive material between the second end of the upper electrode layer 410 and the lead-out electrode 220.

The opening in the photoresist layer may have a width gradually decreasing from the bottom upward so that its side surface is inclined. Specifically, the opening in the photoresist layer may have a cross section, for example, with a trapezoidal shape. This can effectively reduce the subsequent deposition of a conductive material on the side surface of the opening in the photoresist layer, making the lift-off of the photoresist layer easier.

In Step 2, a conductive material layer is formed, which partially covers the top surface of the photoresist layer and partially resides in the contact window 310 exposed in the opening, thus connecting the lead-out electrode 220. In this embodiment, the conductive material layer partially resides in the contact window 310 and on the lead-out electrode 220. The conductive material layer may be formed by, for example, a vapor deposition process, from a material containing, for example, at least one of aluminum (Al), gold (Au), copper (Cu) and molybdenum (Mo).

Further, since the second end of the upper electrode layer 410 and the lead-out electrode 220 in the contact window 310 are both exposed in the opening in the photoresist layer, the portion of the conductive material layer deposited in the opening is connected to the second end of the upper electrode layer 410 and the lead-out electrode 220.

As described above, in this embodiment, as the side surface of the opening in the photoresist layer is inclined, during formation of the conductive material layer by vapor deposition, deposition of the conductive material onto the side surface of the opening in the photoresist layer is effectively avoided, helping in separating the portion of the conductive material layer situated in the opening from the portion of the conductive material layer residing on the top surface of the photoresist layer. This can make the subsequent removal of the photoresist layer easier.

In Step 3, the photoresist layer is lifted off to remove the portion of the conductive material layer covering the photoresist layer, so that the portion of the conductive material layer remaining in the opening constitutes the contact pad 600 that is electrically connected to the upper or lower electrode layer. In this embodiment, the contact pad 600 is electrically connected to the upper electrode layer 410.

Specifically, the lift-off of the photoresist layer is usually accomplished by spraying a liquid onto the photoresist layer at a significant pressure. It is to be noted that, conventionally, before the photoresist layer is formed, the passivation layer 500 has been partially suspended, and when stressed by the great spray pressure during the lift-off of the photoresist layer, the suspended portion of the suspended portion is prone to breakage.

By contrast, in this embodiment, during the lift-off of the photoresist layer, the passivation layer 500 is not suspended at all due to the presence of the sacrificial portion 420 and will thus not collapse at an even higher spray pressure. Therefore, optionally, the spray pressure may be increased in order to achieve even higher photoresist layer removal efficiency.

Furthermore, it is to be also noted that the photoresist layer is often formed by a coating process. Therefore, for example, in the conventional practice, photoresist tends to be also filled in the gap under the suspended portion during the coating process. For example, as shown in FIG. 1b, during direct formation of the photoresist layer on the passivation layer, it tends to happen that part of the photoresist is filled in the space under the suspended portion. This is difficult to be removed during the subsequent lift-off of the photoresist layer. In contrast to this, in this embodiment, prior to the formation of the photoresist layer, there is no space under the end portion of the passivation layer that any photoresist can be filled in, due to the presence of the sacrificial portion 420. Thus, the issue of residual photoresist is effectively mitigated.

Figure 3G:
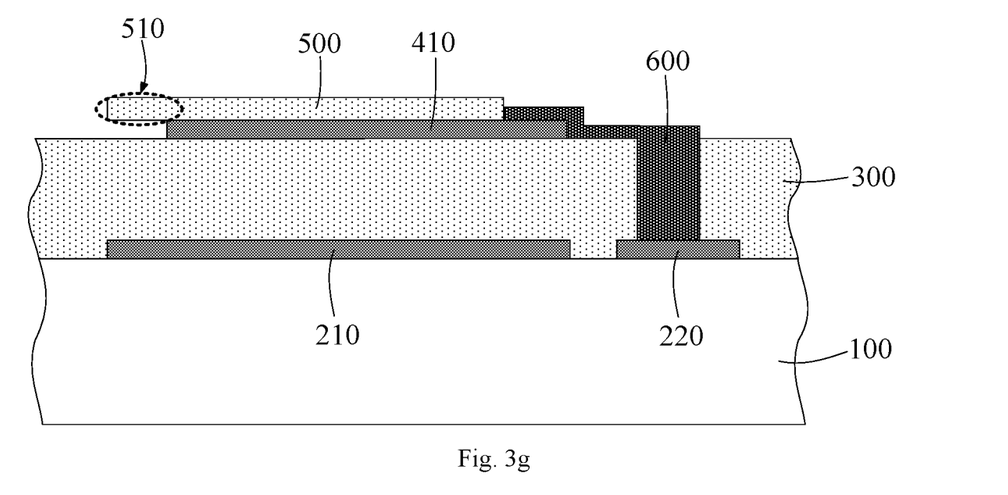

In step S500, with particular reference to FIG. 3g, the sacrificial portion 420 is removed, forming a gap under the passivation layer 500, so that a portion of the passivation layer 500 above the gap defines a suspended portion 510. Specifically, the sacrificial portion may be removed by a lateral wet etching process.

It is to be noted that, in case of the semiconductor device being used in a BAW filter, the suspended portion 510 of the passivation layer 500 can impart an improved quality factor (Q value) to the BAW filter because it can facilitate transverse sound waves excited therein to be scattered out of the device so that they will not stay therein and excite harmful transverse modes. In addition, the suspended portion 510 of the passivation layer 500 can also impart an effectively reduced parasitic capacitance of the semiconductor device.

Additionally, in specific embodiments, the method may further include forming a cavity in the substrate 100 under the lower electrode layer 210. Specifically, the formation of the cavity may include:

first of all, before the formation of the lower electrode layer, forming a recess in the substrate 100 and filling the recess with a filling layer, wherein the filling layer may be formed of the same material, such as silicon oxide, as the subsequently formed sacrificial portion, so that the filling layer can be removed along the sacrificial portion subsequently;

then successively performing steps S100-S400 as described above and forming a through hole during the performance of steps S100-S400, which extends through the piezoelectric material layer 300 to the filling layer; and afterward, in step S500, removing the filling layer via the through hole so that the cavity is formed in the substrate 100. Therefore, in this embodiment, the filling layer can be removed in the same step as the removal of the sacrificial portion 420. This can simplify the overall process and reduce the number of steps therein.

Of course, in alternative embodiments, a through hole may also be formed in the substrate 100 under the filling layer, so that its top is located at the filling layer. In this case, the cavity can be formed by removing the filling layer from a backside of the substrate 100.

On the basis of the above method, in this embodiment, there is also provided a semiconductor device, which, as shown in FIG. 3g, includes:

the substrate 100;

the lead-out electrode 220 on the substrate 100;

the lower electrode layer 210 on the substrate 100;

the piezoelectric material layer 300 on the substrate 100, which covers both the lower electrode layer 210 and the lead-out electrode 220, and a contact window extending downward to the lead-out electrode 220 is formed in the piezoelectric material layer 300;

the upper electrode layer 410 on the piezoelectric material layer 300, the upper electrode layer 410 having an end away from the contact window, which is defined as a first end thereof;

the passivation layer 500 on the upper electrode layer 410, the passivation layer 500 extending beyond the first end of the upper electrode layer 410 so as to define a suspended portion 510, the suspended portion 510 of the passivation layer 500 having a width ranging, for example, from 0.7 μm to 3 μm; and the contact pad 600 formed at least within the contact window so as to electrically connecting the lead-out electrode 220, the contact pad 600 configured for electrically leading out the upper or lower electrode layer.

In this embodiment, the lead-out electrode 220 is configured for electrically connection of the upper electrode layer 410. Therefore, the lead-out electrode 220 and the lower electrode layer 210 may be spaced apart from each other on the substrate 100. In addition, the upper electrode layer 410 may be formed close to a second end of the contact window so that it is exposed from the passivation layer 500. Further, in addition to filling up the contact window so as to electrically connect the lead-out electrode 220, the contact pad 600 may also cover a second end of the upper electrode layer 410, thus further electrically connecting the upper electrode layer 410.

Of course, in alternative embodiments, the lead-out electrode 220 may electrically connect the lower electrode layer 210. In these embodiments, the lead-out electrode 220 and the lower electrode layer 210 may be connected to each other on the substrate 100.

In summary, in the semiconductor device according to this embodiment, the end portion of the passivation layer sought to be protected is supported by the sacrificial portion and not suspended and is thus able to withstand a great pressure. As such it will not be damaged during the subsequent formation of the contact pad. Additionally, subsequent to the formation of the contact pad, the sacrificial portion is removed, freeing up the space under the end portion of the passivation layer and turning this portion into a suspended portion. This can ensure good performance of the semiconductor device. In particular, in case of the contact pad being fabricated using a lift-off process, the passivation layer can withstand a high liquid spray pressure without breakage and allows an even higher liquid spray pressure to be used in photoresist removal. As a result, an improvement in photoresist lift-off efficiency can be obtained, and the issue of incomplete photoresist removal can be mitigated.

Therefore, compared to the conventional practice of forming the suspended portion of the passivation layer prior to the formation of the contact pad, the method according to this embodiment immunizes the subsequently-formed suspended portion from any impact of previous processes and addresses the problem of easy breakage of the suspended portion of the passivation layer as often found in the conventional practice.

Furthermore, conventionally, since the suspended portion of the passivation layer is already present prior to the formation of the contact pad using a lift-off process, it tends to occur, during the lift-off process, that photoresist is partially filled in the gap between the suspended portion and hard to be removed. Compared to the conventional practice, in this embodiment, the passivation layer is not suspended at all during the lift-off process, eliminating the chance for any lift-off process to be filled under the passivation layer. This can effectively mitigate the problem of residual photoresist.

It is noted that while the invention has been described with reference to several preferred embodiments, it is not intended to be limited to these embodiments in any way. In light of the above teachings, any person of skill in the art may make various possible variations and changes to the subject matter of the present invention or modify it to equivalent alternatives without departing from the scope of the invention. Accordingly, any and all such simple variations, equivalent alternatives and modifications made without departing from the scope of the invention are intended to fall within this scope.

It is also noted that the terms "first", "second", "third" and the like as used herein are only intended to distinguish between various components, elements, steps, etc. rather than implying any logical or ordinal relationship among them, unless otherwise specified or indicated.

It is also to be understood that the terminology used herein is used for the purpose of describing particular embodiments only, and is not intended to limit the scope of the present invention. It must be noted that as used herein and in the appended claims, the singular forms "a" and "an" include the plural reference unless the context clearly dictates otherwise. Thus, for example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Implementation of the methods and/or device according to the embodiments of the present invention involves performing or completing certain selected tasks or steps manually, automatically, or a combination thereof.

For ease of description, relative spatial terms such as "above", "under", "upper" and "lower" may be used in the description of some embodiments disclose herein to describe how one element or component is related to another element or component, or to other elements or components, as in the accompanying drawings illustrating the embodiments. It is to be understood that, apart from those shown, such relative spatial terms are also intended to describe various orientations that can be assumed in use or operation of the device shown. For example, if the device is turned upside down, then an element or component described as being "under" or "below" another element or component should now be described as being "above" or "on top of" the other element or component.

What is claimed is:

1. A method of fabricating a semiconductor device, the method comprising:
   providing a substrate having a lower electrode layer and a lead-out electrode formed thereon, the substrate further having a piezoelectric material layer formed over the lower electrode layer and the lead-out electrode;
   forming an upper electrode layer and a sacrificial portion on the piezoelectric material layer, the sacrificial portion having a side surface adjacent to a side surface of a first end of the upper electrode layer;
   forming a passivation layer covering a top surface of the upper electrode layer and a top surface of the sacrificial portion with at least one side surface of the sacrificial portion being exposed;
   etching the piezoelectric material layer to form a contact window in which the lead-out electrode is exposed, and forming a contact pad on the lead-out electrode, the contact pad electrically connected to the lead-out electrode and configured for electrically leading out the upper electrode layer or the lower electrode layer; and
   removing the sacrificial portion to form a gap under the passivation layer, so that a portion of the passivation layer above the gap defines a suspended portion.

2. The method of claim 1, wherein the sacrificial portion is formed subsequent to the formation of the upper electrode layer, and wherein forming the sacrificial portion comprises:
   forming a sacrificial material layer; and
   partially removing the sacrificial material layer so that a portion of the sacrificial material layer on the side surface of the first end of the upper electrode layer is remained and forms the sacrificial portion.

3. The method of claim 1, wherein a portion of the sacrificial portion that is covered by the passivation layer has a width of from 0.7 µm to 3 µm.

4. The method of claim 1, wherein removing the sacrificial portion comprises etching away the sacrificial portion by a wet etching process.

5. The method of claim 1, wherein the passivation layer entirely covers the top surface of the sacrificial portion, with a side surface of the passivation layer being aligned with a side surface of the sacrificial portion, or wherein the passivation layer partially covers the top surface of the sacrificial portion, with the side surface of the sacrificial portion protruding beyond the side surface of the passivation layer.

6. The method of claim 1, wherein the lead-out electrode is configured to electrically leading out the upper electrode layer, and wherein subsequent to the formation of the passivation layer, a second end of the upper electrode layer that is located close to the lead-out electrode is exposed and electrically connected to the lead-out electrode using a conductive material.

7. The method of claim 1, wherein forming the contact pad comprises:
   forming a photoresist layer covering the piezoelectric material layer and the passivation layer and having an opening formed therein, the opening in the photoresist layer exposing the contact window;
   forming a conductive material layer covering the photoresist layer and inner surfaces of the contact window exposed in the opening so as to be connected to the lead-out electrode; and
   lifting off the photoresist layer so that a portion of the conductive material layer overlying the photoresist layer is removed, with a remaining portion of the conductive material layer in the opening forming the contact pad.

8. The method of claim 7, wherein subsequent to the formation of the passivation layer, a second end of the upper electrode layer close to the lead-out electrode is exposed,
   wherein during the formation of the photoresist layer, both the contact window and the second end of the upper electrode layer are exposed in the opening, and wherein the conductive material layer is formed to also cover the second end of the upper electrode layer so as to electrically connecting the second end to the contact pad.

9. The method of claim 1, wherein a filling layer is further formed in the substrate under the lower electrode layer, and wherein the method further comprises: forming a through hole in the piezoelectric material layer or in the substrate, the through hole extending to the filling layer; and
   forming a cavity in the substrate by removing the filling layer via the through hole while removing the sacrificial portion.

10. The method of claim 1, wherein the semiconductor device comprises a bulk acoustic wave filter.

* * * * *